United States Patent
Mueller et al.

(10) Patent No.: US 9,425,258 B2
(45) Date of Patent: Aug. 23, 2016

(54) SEMICONDUCTOR DEVICE

(71) Applicants: NXP B. V., Eindhoven (NL); Taiwan Semiconductor Manufacturing Company Ltd., Hsinchu (TW)

(72) Inventors: Markus Mueller, Brussels (BE); Anco Heringa, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/703,731

(22) Filed: May 4, 2015

(65) Prior Publication Data

US 2015/0236095 A1 Aug. 20, 2015

Related U.S. Application Data

(62) Division of application No. 13/676,903, filed on Nov. 14, 2012, now abandoned.

(30) Foreign Application Priority Data

Dec. 19, 2011 (EP) ..................................... 11194254

(51) Int. Cl.
| | |
|---|---|
| *H01L 29/66* | (2006.01) |
| *H01L 29/10* | (2006.01) |
| *H01L 29/778* | (2006.01) |
| *H01L 29/872* | (2006.01) |
| *H01L 29/12* | (2006.01) |
| *H01L 29/20* | (2006.01) |
| *H01L 29/205* | (2006.01) |

(52) U.S. Cl.
CPC .......... *H01L 29/1054* (2013.01); *H01L 29/122* (2013.01); *H01L 29/2003* (2013.01); *H01L 29/205* (2013.01); *H01L 29/7783* (2013.01); *H01L 29/872* (2013.01)

(58) Field of Classification Search
CPC ..................... H01L 29/2003; H01L 29/66462; H01L 29/205; H01L 29/122
USPC .................................................. 257/192–194
See application file for complete search history.

(56) References Cited

U.S. PATENT DOCUMENTS

| | | |
|---|---|---|
| 8,461,626 B2 | 6/2013 | Renaud |
| 2006/0220065 A1 | 10/2006 | Kawasaki et al. |

(Continued)

FOREIGN PATENT DOCUMENTS

| | | |
|---|---|---|
| CN | 101145524 A | 3/2008 |
| CN | 101312207 A | 11/2008 |
| CN | 101689564 A | 3/2010 |

OTHER PUBLICATIONS

Ibbetson, J. P., et al.; "Polarization Effects, Surface States and the Source of Electrons in AlGaN/GaN Heterostructure Field Effect Transistors"; Appl. Phys. Lett., vol. 77, No. 2; p. 250-252 (Jul. 10, 2000).

(Continued)

*Primary Examiner* — Tran Tran

(57) ABSTRACT

A semiconductor device and a method of making the same. The device includes a semiconductor substrate having an AlGaN layer on a GaN layer. The device also includes first contact and a second contact. The average thickness of the AlGaN layer varies between the first contact and the second contact, for modulating the density of an electron gas in the GaN layer between the first contact and the second contact.

20 Claims, 3 Drawing Sheets

(56) References Cited

U.S. PATENT DOCUMENTS

2009/0315075 A1    12/2009  Sato
2011/0233520 A1*   9/2011  Jeon ...................... B82Y 10/00
                                                                   257/20

OTHER PUBLICATIONS

Rajabi, Saba et al.; "A Novel Power High Electron Mobility Transistor with Partial Stepped Recess in the Drain Access Region for Performance Improvement"; Proceedings of the 2011 Intl. Conf. on Signal Processing, Communication, Computing and Networking Technologies; IEEE; pp. 269-271 (Jul. 21, 2011).

Extended European Search Report for appln. No. 11194254.6 (Apr. 24, 2012).

Office Action from counterpart application CN 2015012801325890, Feb. 2, 2015.

* cited by examiner

SEMICONDUCTOR DEVICE

BACKGROUND OF THE INVENTION

This invention relates to a semiconductor device. In particular, this invention relates to a semiconductor device having a semiconductor substrate including an AlGaN layer on a GaN layer.

In recent years, GaN High Electron Mobility Transistor (HEMT) devices have drawn a lot of attention regarding their high potential to replace Si or SiC for use as High Voltage (HV) devices. GaN HEMTs are typically fabricated by applying ohmic source and drain contacts and a Schottky gate contact on top of an epitaxially grown structure including an AlGaN barrier layer on a GaN channel layer.

As AlGaN is a piezoelectric material, the lattice mismatch between GaN layer and the AlGaN layer gives rise to a potential difference over the barrier, which modulates the band structure in such a way that a quantum well filled by two dimensional electron gas spontaneously forms in the GaN near the AlGaN/GaN interface. The high mobility of this electron gas leads to devices having very low resistance compared to other kinds of Field Effect Transistor (FET). As with other FETs, the conductivity in the channel can be modulated by the application of a potential to the gate.

GaN HEMT devices find application as RF power devices in areas where high gain and low noise are required at high frequency. They offer the advantages of higher efficiencies, larger bandwidth and larger temperature range over Si LDMOS and of higher polarization voltage over GaAs HEMT devices. Moreover, GaN HEMT devices start to penetrate e.g. the power conversion market in the voltage range from 50V to 600V, where the GaN devices offer very low specific on-resistances compared to Si based contenders and at lower prices than the competing wide-band-gap material SiC devices.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a semiconductor device including a semiconductor substrate having an AlGaN layer on a GaN layer. The device also includes a first contact and a second contact. The average thickness of the AlGaN layer varies between the first contact and the second contact, for modulating the density of an electron gas in the GaN layer between the first contact and the second contact.

According to another aspect of the invention, there is provided a method of making a semiconductor device. The method includes forming an GaN layer on a substrate. The method also includes forming an AlGaN layer on the GaN layer. The method further includes forming a first contact and a second contact of the device. The method also includes varying the average thickness of the AlGaN layer between the first contact and the second contact, for modulating the density of an electron gas in the GaN layer between the first contact and the second contact.

In a semiconductor device having an AlGaN layer on a GaN layer, the density of the electron gas in the GaN layer is sensitive to the thickness of the AlGaN layer (Appl. Phys. Lett., Vol. 77, No. 2, 10 July 2000). The thicker the AlGaN barrier layer (for a given Al content), the stronger will be the voltage drop given by the existence of polarization charges at the top and bottom interfaces of this barrier layer, which in return will increase the depth of the quantum well formed in the GaN near the AlGaN/GaN interface. This leads to a higher sheet carrier density of the electron gas and a lower sheet resistance.

In accordance with this invention, it has been realised that this effect can be used to modulate the density of the electron gas between the contacts of a semiconductor device. The modulation of the electron gas in turn produces a device having a resistivity that varies between those contacts. As described herein, the modulation profile of the electron gas between the contacts can take a number of different forms.

The variation in the average thickness of the AlGaN layer can be implemented in a number of ways. For example, at least part of an upper surface of the AlGaN layer can include a plurality of recesses for varying an average thickness of the AlGaN layer. These recesses can be formed using standard semiconductor processing techniques such a lithography and surface etching. It is noted that the recesses can be formed using a single lithographic/etch sequence, minimising the impact of the recesses on existing process flows. The well established nature of these techniques also allows great flexibility in tailoring the configuration of the recesses. For example the density (e.g. pitch), width or depth of the recesses can be varied between different areas of the AlGaN layer, whereby the average thickness of the layer is also varied. In one embodiment, the depth of the recesses is between 30% and 100% of the local thickness of the AlGaN layer.

As used herein, the term "average thickness" refers not to the local thickness of the AlGaN layer at any given position, but instead to the macroscopic thickness of the AlGaN layer, averaged over a given area. For example, it will be appreciated that the local thickness of the AlGaN layer can vary dramatically in areas where the layer is provided with the above mentioned recesses. Nevertheless, the average thickness of the AlGaN layer in those areas will take a certain value which varies only in the macroscopic sense, as parameters such as the density, size or depth of the recesses varies across the layer. The term "average thickness" accordingly refers to the thickness of the AlGaN layer in the latter, macroscopic sense.

The density, width or pitch of the recesses can vary across the surface of the AlGaN layer. The depth of the recesses can also be varied. The average thickness T of the AlGaN layer between the first contact and the second contact can be in the range 10 nm<T<40 nm.

In addition to the flexibility in the density and/or depth of the recesses, there is also flexibility in the shape of the recesses. For example, the recesses could be provided in the form of dimples or grooves. As noted above, the density of the dimples or grooves (i.e. the spacing between adjacent recesses) can be varied to vary the macroscopic average thickness. Recesses in the form of grooves can be provided in the form of a grid.

In some embodiments, the semiconductor device can comprise a High Electron Mobility Transistor (HEMT) having a source, a gate and a drain. In these embodiments, the first contact can comprise the source, and the second contact can comprise the drain.

In one embodiment, the AlGaN layer can have a larger average thickness between the source and the gate than between the gate and the drain. This results in a device in which the sheet resistance of the electron gas between the source and the gate is lower than the sheet resistance of the electron gas between the gate and the drain (owing to the differences in the electron gas densities in those regions caused by the change in thickness of the AlGaN layer). The modulation of the electron gas density (and consequently the sheet resistance of the electron gas) in this way thus allows an improved trade-off between the on-state resistance and breakdown voltage of the device.

In some examples, the thickness of the AlGaN layer can be substantially constant between the source and the gate. In such examples, steps taken to varying the average thickness between the source and the drain can be restricted to the gate-drain side of the device.

In accordance with an embodiment of the invention, the average thickness of the AlGaN layer can increase from the gate to the drain. The increase in thickness of the AlGaN layer increases the density of the electron gas towards the drain, while suppressing it towards the gate. The resulting gradual profile of sheet resistance of the electron gas from the gate (on the gate-drain side of the device) to the drain enhances the performance of the device and allows a better trade-off between the on-state resistance and breakdown voltage.

The variation in average thickness of the AlGaN layer between the gate and the drain can take a number of different forms. For example, the thickness can increase monotonically from the gate to the drain (that is to say, the average thickness rises between the gate and the drain without falling at any point). The thickness increase can occur in a number of steps, or alternatively there can be a smooth transition (e.g. linear).

In one embodiment, the semiconductor device can be a Schottky barrier diode. In this embodiment, the first contact can comprise the anode of the Schottky barrier diode, and the second contact can comprise the cathode. In a manner analogous to that described above in respect of the HEMT device, the average thickness of the AlGaN layer in the Schottky barrier diode can increase from the anode to the cathode. The increase can be either linear or take the form of a series of one or more steps.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Figure 1:
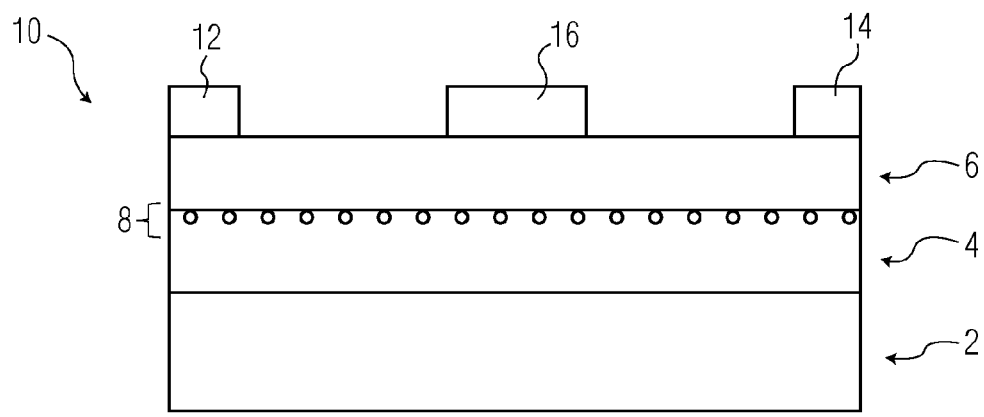
FIG. 1 shows a semiconductor device including an AlGaN layer on a GaN layer.

FIG. 1 illustrates an example of a High Electron Mobility Transistor semiconductor device 10 including an AlGaN layer 6 on a GaN layer 4. These layers are typically grown epitaxially on a semiconductor substrate 2, which may, for example, comprise SiC. On an upper surface of the AlGaN layer there are provided a source 12, a gate 16 and a drain 14. The source 12 and drain 14 include ohmic contacts, while in this example the gate 16 comprises a Schottky contact.

As described previously, the lattice mismatch between the AlGaN layer 6 and the GaN layer 4 leads to the formation of an electron gas 8 in the GaN layer 4, near to the interface between the GaN layer 4 and the AlGaN layer 6. The mobility of the electron gas 8 in the GaN layer 4 is relatively high, which allows devices of the kind illustrated in FIG. 1 to have very low resistance between the source 12 and the drain 14. As is well known in the art, the channel resistance, determined by the electron gas below the gate 16 can, in use, be altered by the application of a potential to the gate 16.

Figure 2:
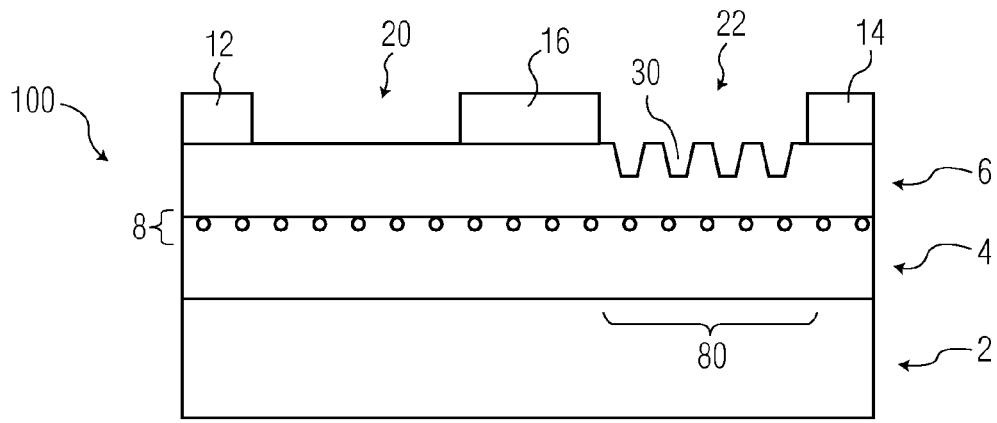
FIG. 2 shows a semiconductor device comprising a High Electron Mobility Transistor (HEMT) according to an embodiment of the invention.

FIG. 2 illustrates a HEMT semiconductor device 100 in accordance with a first embodiment of the invention. The device 100 includes a number of the features described above in relation to the device 10 of FIG. 1. Thus, the device 100 includes a semiconductor substrate 2 (e.g. comprising SiC, Al2O3, Si or any other substrate on which GaN can be epitaxially grown or bonded) on which a GaN layer 4 is provided. An AlGaN layer 6 is provided on the GaN layer 4. In some examples, a buffer layer may be located in between the GaN layer 4 and the AlGaN layer 6. Typically, the GaN layer 4, the AlGaN layer 6 and further layers such as a buffer layer can be grown on the major surface of the substrate 2 using epitaxial growth techniques.

Also in common with the example shown in FIG. 1, the device 100 includes a source 12, a gate 16 and a drain 14. In the present example, the source 12 and drain 14 include ohmic contacts, while the gate 16 includes a Schottky contact. Optionally, the gate may be provided with a dielectric layer (i.e. a non-Schottky gate). The features of the source 12, gate 16 and drain 14 can be conventional in their nature, and will be well recognised by the person skilled in the art.

The AlGaN layer 6 of the device 100 has an average thickness which varies between the source 12 and the drain 16. The average thickness of the AlGaN layer 6 in the devices described herein may vary, for example, from 10 nm to 40 nm.

In general, variations in the average thickness of the AlGaN layer 6 can be used to modulate the density of the electron gas 8 which is located in the GaN layer 4, near to the interface between the GaN layer 4 and the AlGaN layer 6. In the present example, the average thickness of the AlGaN layer 6 is greater on the source-gate side 20 of the device 100 than on the gate-drain side 22 of the device 100. The modulation of the electron gas density (and consequently the sheet resistance of the electron gas) in this way allows an improved trade-off between the on-state resistance and the breakdown voltage of the device. As described below in relation to FIGS. 3 to 5, this trade-off can be further improved in particular by reducing the average thickness of the AlGaN layer close to the gate 16 on the gate-drain side 22 of the device 100.

In the present embodiment (FIG. 2), the average thickness of the AlGaN layer 6 is substantially constant on the source-gate side 20 of the device 100. Consequently, the density of the electron gas 8 in the GaN layer 4 is substantially uniform on the source-gate side 20 of the device 100.

As shown in FIG. 2, AlGaN layer 6 of the device 100 has an average thickness on the gate-drain side 22 that is smaller than on the source-gate side 20. This change in thickness could, in principal, be achieved by masking the device 100 on the source-gate side 20 and etching back the AlGaN layer 6 on the gate-drain side 22. In such an example, the thickness of the AlGaN layer 6 on the gate-drain side 22 would, like the thickness of the AlGaN layer 6 on the source-gate side 20, be substantially constant, albeit thinner.

However, in accordance with an embodiment of this invention, it has been determined that the average thickness of the AlGaN layer 6 can also be varied by providing the AlGaN layer 6 with a series of recesses 30 on an upper surface thereof. As mentioned above, although the thickness of the AlGaN layer 6 in such examples varies locally between the recessed and non-recessed portions thereof, the overall effect is that the average (macroscopic) thickness of the AlGaN layer 6 is lessened by the presence of the recesses 30. This still achieves the effect of reducing the electron gas density in the GaN layer 4 by allowing the lattice of the AlGaN layer 6 to relax to a certain degree, weakening the mismatch effect described above. Additionally however, use of recesses such as those described herein provides a high degree of flexibility for varying the thickness of the AlGaN layer 6 across the device 100. This is because the configuration (e.g. depth, width, shape, pitch) of the recesses 30 can be defined in a highly controlled manner using lithography and etching steps.

Returning to the Example of FIG. 2, the effect of the recesses 30, reducing the average thickness of the AlGaN layer 6 on the gate-drain side 22, lowers the electron density in the electron gas 8 in the region 80 beneath the recesses. It is noted that the recesses in the Figures of this application are shown only schematically. In accordance with an embodiment of the invention, in order to guarantee a macroscopically defined, smoothed out sheet resistance, both the spacing and/or width of the grooves should be comparable to the thickness of the AlGaN barrier layer. For example, the spacing and/or width of the grooves can be from one to four times the thickness of the AlGaN barrier layer.

Figure 3:
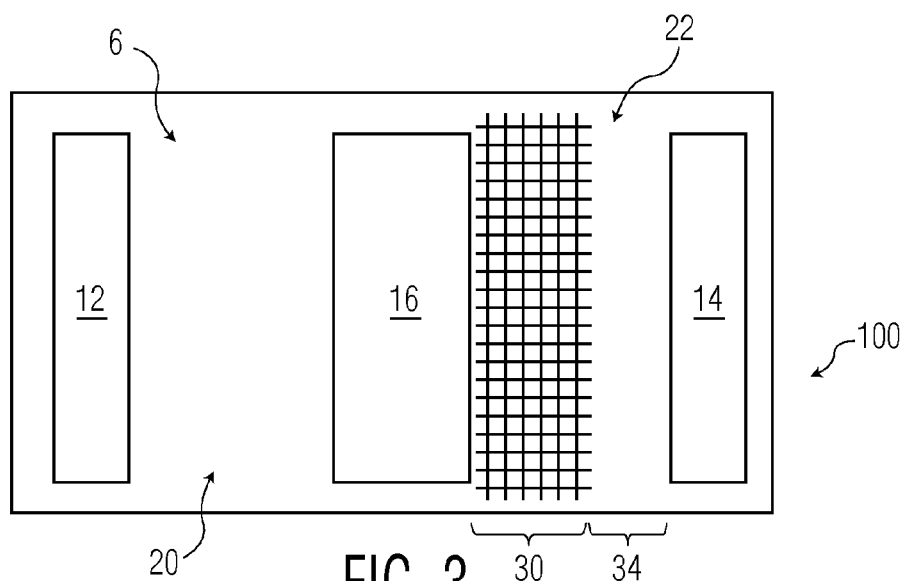
FIG. 3 shows a semiconductor device comprising a High Electron Mobility Transistor (HEMT) according to another embodiment of the invention.
Figure 4:
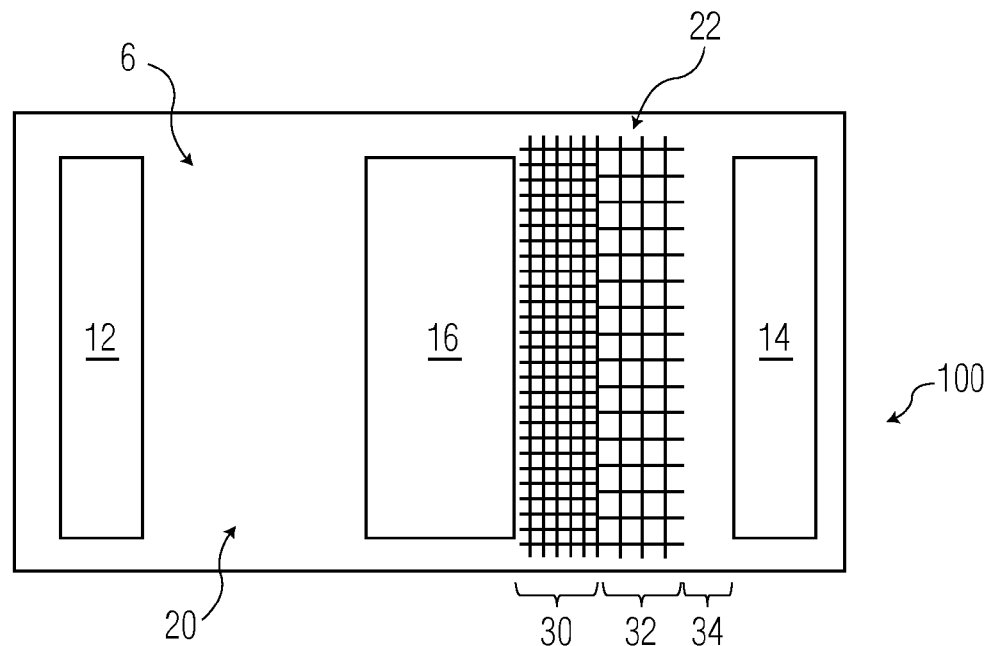
FIG. 4 shows a semiconductor device comprising a High Electron Mobility Transistor (HEMT) according to a further embodiment of the invention.
Figure 5:
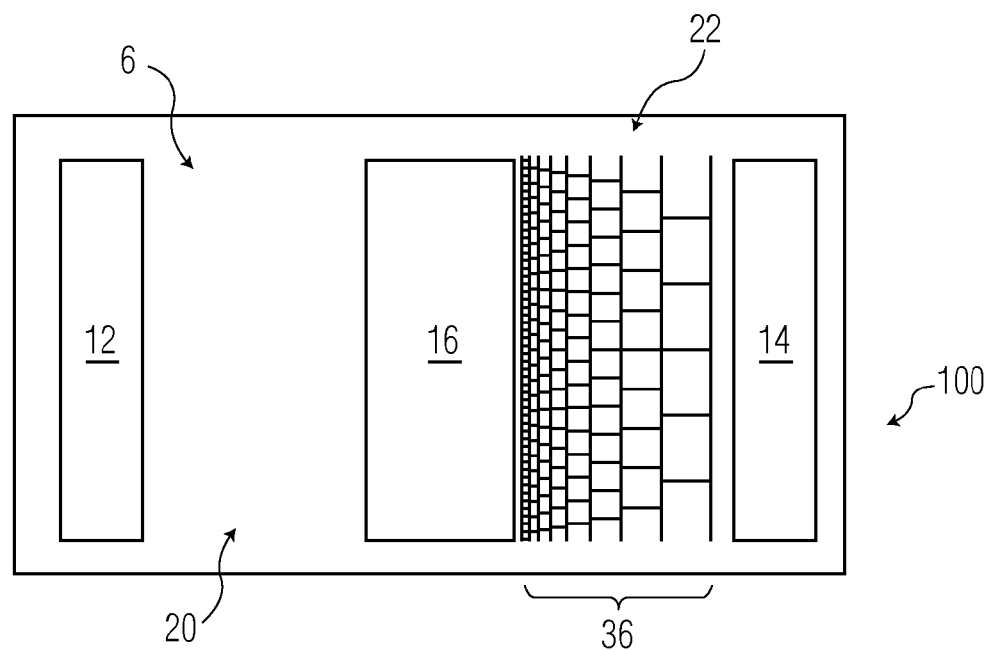
FIG. 5 shows a semiconductor device comprising a High Electron Mobility Transistor (HEMT) according to another embodiment of the invention.

FIGS. 3 to 5 illustrate HEMT devices 100 in accordance with further embodiments of the invention, viewed from above the substrate 2. It is envisaged that the cross sectional arrangement of these further embodiments may be broadly similar to that shown in FIG. 2, except for the configuration of the recesses 30 and the corresponding densities in the electron gas 8 in the GaN layer 4 as described in more detail below.

The device 100 shown in FIG. 3 includes recesses 30 that are provided in the form of grooves in the upper surface of the AlGaN layer. In alternative embodiments, the recesses may take different forms. For example, the recess could be provided in the form of a plurality of dimples in the upper surface of the AlGaN layer 6. The dimples may be arranged in a regular pattern or array, such that the average thickness of the AlGaN layer 6 does not vary unintentionally from area to area. In terms of local thickness, the depth of the recesses can be between 30% and 100% of the local thickness of the AlGaN layer 6.

As noted above, the grooves shown in FIG. 3 can be formed using lithography and etching techniques. In the present example, the grooves are provided in a grid like configuration. The grid itself is positioned adjacent the gate 16, and need not extend all the way to the drain 14 to achieve the improvement in the trade-off between the on-state resistance and the breakdown voltage of the device noted above. As shown in FIG. 3, an area 34 of the surface of the AlGaN layer 6 on the gate-drain side 22 of the device 100 may be free from recesses. In the present example, that area 34 is adjacent the drain 14.

The spacing of the recesses 30 can be chosen in accordance with the desired average thickness of the AlGaN layer 6. Additionally, in principal it is also possible to vary the depth of the recesses to tune the average thickness of the AlGaN layer 6. However, manufacture of a device having recesses of various depths would be relatively complicated in comparison simply varying the recess spacing or width, since multiple masks and etching steps would be required.

FIG. 4 illustrates an example of a HEMT device 100 in which recesses are provided which have different spacings therebetween, in different areas of the surface of the AlGaN layer 6 (i.e. the density of the recesses on the surface of the AlGaN layer 6 varies). In particular, the density of the recesses 30 (comprising grooves in a grid configuration in the present example), is higher in an area closest to the gate 16. In a neighbouring area 32, the density of the recesses is somewhat lower. Finally, in an area 34 adjacent the drain 14, the recesses are absent. Thus, the average thickness of the AlGaN layer 6 on the gate-drain side 22 of the device varies in a step-like manner from a thinnest area adjacent the gate, via an area 32 having intermediate thickness, to a thickest area 34 which is adjacent the drain 16. This variation in the average thickness of the AlGaN layer 6 allows the electron density in the gas 8 to be varied accordingly. Once again, these variations can be used to tune the trade-off between the on-state resistance and the breakdown voltage of the device.

FIG. 5 illustrates a further example of a HEMT device 100 in accordance with an embodiment of the invention. In contrast with the device 100 shown in FIG. 4, in which the density of the recesses 30 on the surface of the AlGaN layer 6 vary in a step like manner, in the present example the density of the recesses varies substantially continuously in a region 36 on the gate-drain side 22. The average thickness of the AlGaN layer 6 varies in a correspondingly continuous manner, as does the sheet density and sheet resistance of the electron gas 8 in the GaN layer. This continuous variation in density can be achieved in the manner shown in FIG. 5, using changes in the spacings or widths between neighbouring grooves arranged in a grid. Alternative embodiments are envisaged however, such as a continuous change in the spacing between neighbouring dimples provided in the AlGaN layer 6 surface. It is also envisaged that a combination of the stepped approach and the continuously varying approach described above could be employed in different regions of the same device.

Figure 6:
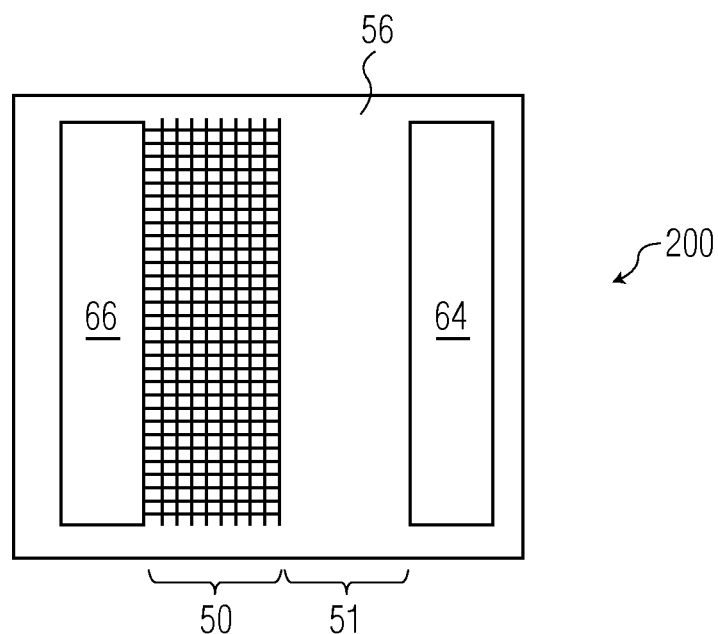
FIGS. 6 and 7 show a semiconductor device comprising a Schottky barrier diode according to a further embodiment of the invention.
Figure 7:
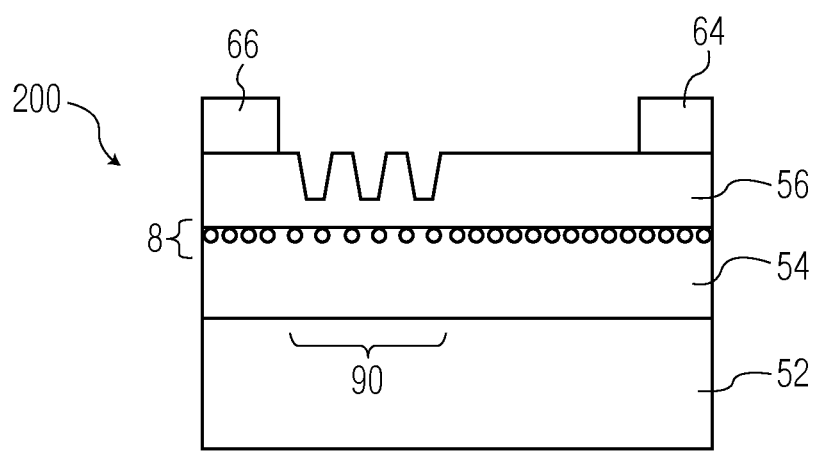

FIGS. 6 and 7 illustrate a semiconductor device 200 comprising a Schottky barrier diode, in accordance with an embodiment of the invention. The device 200 includes a first contact 66 forming an anode of the diode, and a second contact 64 forming a cathode. As can be seen from FIG. 7, the layer structure of the device 200 is similar to that of the HEMT devices described above. Thus, the device 200 includes a substrate 52 (which, as noted above, can comprise SiC, Al2O3, Si or any other substrate on which GaN can be epitaxially grown or bonded), a GaN layer 54 and an AlGaN barrier layer 56.

As with the HEMT devices described above, an electron gas 8 forms in the

GaN layer 54 near the interface between the GaN layer and the AlGaN layer 56. The carrier density of the gas 8 can be modulated between the anode and the cathode in much the same way as described for the HEMT devices.

Accordingly, as shown in FIGS. 6 and 7, a plurality of recesses 50 can be provided on an upper surface of the AlGaN layer 56. The recesses can be configured in accordance with any of the above described HEMT related examples in terms of shape, depth, width, density (pitch) and location. In the example of FIGS. 6 and 7, the recesses are provided in a grid arrangement adjacent the anode 66, while an area 51 of the surface of the AlGaN layer 56 adjacent the cathode 64 is free from recesses. As shown in FIG. 7, this arrangement of recesses lowers the electron density in the electron gas 8 in the region 90 beneath the recesses, while a higher density remains beneath the region 51 adjacent the cathode 64. Thus the carrier density increases from the anode 66 to the cathode 64.

Accordingly, there has been described a semiconductor device and a method of making the same. The device includes a semiconductor substrate having an AlGaN layer on a GaN layer. The device also includes first contact and a second contact. The average thickness of the AlGaN layer varies between the first contact and the second contact, for modulating the density of an electron gas in the GaN layer between the first contact and the second contact.

Although particular embodiments of the invention have been described, it will be appreciated that many modifications/additions and/or substitutions may be made within the scope of the claimed invention.

The invention claimed is:
1. A semiconductor device comprising:
a semiconductor substrate including an AlGaN layer on a GaN layer;
a source;
a drain; and
a gate, which together define a source-gate side and a drain-gate side;
wherein the average thickness of the AlGaN layer varies between the source and the drain, for modulating the density of an electron gas in the GaN layer between the source and the drain;
wherein at least part of an upper surface of the AlGaN layer includes grooves in a grid that defines a grid pattern;
wherein the AlGaN layer has a larger average thickness between the source and the gate than between the gate and the drain.
2. The device of claim 1, wherein the depth of the grooves is between 30% and 100% of the local thickness of the AlGaN layer.
3. The device of claim 1, wherein the average thickness T of the AlGaN layer between the source and the drain is in the range 10 nm <T <40 nm.
4. The device of claim 1, wherein the grooves have the same depth and at least two different spacings in different areas of the surface of the AlGaN layer.
5. The device of claim 4, wherein the different spacings are in a direction parallel to the source, drain, and gate.
6. The device of claim 5, wherein the grooves are closer together closest to the gate and further apart further from the gate such that the average thickness of the AlGaN layer varies in a step-like manner from a thinnest area adjacent the gate to a thickest area adjacent the drain.
7. The device of claim 5, wherein the grooves are closer together closest to the gate and further apart further from the gate such that the average thickness of the AlGaN layer varies in a linear manner from a thinnest area adjacent the gate to a thickest area adjacent the drain.
8. The device of claim 5, wherein the grooves are closer together closest to the gate and further apart further from the gate such that the average thickness of the AlGaN layer varies in a continuous manner from a thinnest area adjacent the gate to a thickest area adjacent the drain.
9. A semiconductor device comprising:
a semiconductor substrate including an AlGaN layer on a GaN layer;
a source;
a drain; and
a gate, which together define a source-gate side and a drain-gate side;
wherein the average thickness of the AlGaN layer varies between the source and the drain, for modulating the density of an electron gas in the GaN layer between the source and the drain;
wherein at least part of an upper surface of the AlGaN layer includes grooves in a grid that defines a grid pattern;
wherein the average thickness of the AlGaN layer increases from the gate to the drain.
10. The device of claim 9, wherein the AlGaN layer has a larger average thickness between the source and the gate than between the gate and the drain.
11. The device of claim 9, wherein the grooves have the same depth and at least two different spacings in different areas of the surface of the AlGaN layer.
12. The device of claim 9, wherein the depth of the grooves is between 30% and 100% of the local thickness of the AlGaN layer.
13. A semiconductor device comprising:
a semiconductor substrate including an AlGaN layer on a GaN layer;
a source;
a drain; and
a gate, which together define a source-gate side and a drain-gate side;
wherein the average thickness of the AlGaN layer varies between the source and the drain, for modulating the density of an electron gas in the GaN layer between the source and the drain;
wherein at least part of an upper surface of the AlGaN layer includes grooves in a grid that defines a grid pattern;
wherein the grid pattern of grooves is adjacent to the gate and an area of the upper surface of the AlGaN layer adjacent to the drain is free from grooves.
14. A semiconductor device comprising:
a semiconductor substrate including an AlGaN layer on a GaN layer;
a first contact; and
a second contact;
wherein the average thickness of the AlGaN layer varies between the first contact and the second contact, for modulating the density of an electron gas in the GaN layer between the first contact and the second contact;
wherein at least part of an upper surface of the AlGaN layer includes grooves in a grid that defines a grid pattern;
wherein the average thickness of the AlGaN layer increases from the first contact to the second contact.
15. The device of claim 14, wherein the average thickness of the AlGaN layer increases in a series of one or more steps from the first contact to the second contact.
16. The device of claim 14, wherein the average thickness of the AlGaN layer increases linearly from the first contact to the second contact.
17. The device of claim 14, wherein the average thickness of the AlGaN layer increases continuously from the first contact to the second contact.

18. The device of claim 14, wherein the first contact is characterized as an anode of a diode and the second contact is characterized as a cathode of the diode.

19. A semiconductor device comprising:
   a semiconductor substrate including an AlGaN layer on a GaN layer;
   a first contact; and
   a second contact;
   wherein the average thickness of the AlGaN layer varies between the first contact and the second contact, for modulating the density of an electron gas in the GaN layer between the first contact and the second contact;
   wherein at least part of an upper surface of the AlGaN layer includes grooves in a grid that defines a grid pattern;
   wherein the grid pattern of grooves is adjacent to the first contact and an area of the upper surface of the AlGaN layer adjacent to the second contact is free from grooves.

20. The device of claim 19, wherein the first contact is characterized as an anode of a diode and the second contact is characterized as a cathode of the diode.

\* \* \* \* \*